(12) United States Patent
Jin

(10) Patent No.: US 12,341,022 B2
(45) Date of Patent: Jun. 24, 2025

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 454 days.

(21) Appl. No.: 17/849,015

(22) Filed: Jun. 24, 2022

(65) Prior Publication Data

US 2022/0319863 A1 Oct. 6, 2022

Related U.S. Application Data

(62) Division of application No. 16/853,110, filed on Apr. 20, 2020.

(30) Foreign Application Priority Data

Apr. 22, 2019 (CN) .......................... 201910324876.4

(51) Int. Cl.
*H01L 21/311* (2006.01)
*H01L 21/033* (2006.01)
(Continued)

(52) U.S. Cl.
CPC .... *H01L 21/31144* (2013.01); *H01L 21/0332* (2013.01); *H01L 21/0337* (2013.01); *H01L 21/31116* (2013.01); *H10D 62/151* (2025.01); *H10D 62/364* (2025.01); *H10D 64/511* (2025.01); *H10D 84/83* (2025.01)

(58) Field of Classification Search
CPC . H10B 61/22; H01L 21/3081; H01L 21/3086; H01L 21/76816
See application file for complete search history.

(56) References Cited

U.S. PATENT DOCUMENTS 9,111,874 B2 * 8/2015 Wang .................. H01L 21/3086
2016/0314983 A1 * 10/2016 Han .................... H01L 21/3081
(Continued)

*Primary Examiner* — Karen Kusumakar
(74) *Attorney, Agent, or Firm* — Anova Law Group, PLLC

(57) ABSTRACT

Semiconductor device is provided. The semiconductor device includes a to-be-etched layer having a plurality of first regions and a plurality of second regions that are alternately arranged along a first direction, where the second region includes a second trench region; a first mask layer on the plurality of first regions and the plurality of second regions of the to-be-etched layer; a second mask layer on the first mask layer; a first trench penetrating the first mask layer and the second mask layer over a first region of the plurality of first regions; a mask sidewall spacer on sidewall surfaces of the first trench; and second trenches over the plurality of second trench regions of the plurality of second regions, where a sidewall surface of the second trench exposes a corresponding mask sidewall spacer of an adjacent first trench.

15 Claims, 5 Drawing Sheets

(51) Int. Cl.
    *H10D 62/13*         (2025.01)
    *H10D 62/17*         (2025.01)
    *H10D 64/27*         (2025.01)
    *H10D 84/83*         (2025.01)

(56) References Cited

U.S. PATENT DOCUMENTS

2020/0111677 A1*   4/2020   Srivastava ........ H01L 21/76816
2020/0279739 A1*   9/2020   Jin .................... H01L 21/76816
2020/0279740 A1    9/2020   Jin \* cited by examiner

SEMICONDUCTOR DEVICE AND FABRICATION METHOD THEREOF

CROSS-REFERENCES TO RELATED APPLICATIONS

This application is a divisional of U.S. patent application Ser. No. 16/853,110, filed on Apr. 20, 2020, which claims the priority of Chinese patent application No. 201910324876.4, filed on Apr. 22, 2019, the entirety of which is incorporated herein by reference.

FIELD OF THE DISCLOSURE

The present disclosure generally relates to the field of semiconductor manufacturing technology and, more particularly, relates to semiconductor devices and fabrication methods.

BACKGROUND

In the manufacturing process of semiconductor devices, the patterns on a mask is usually transferred to the substrate by a photolithography process. The photolithography process includes: providing a substrate; forming a photoresist layer on the substrate; exposing and developing the photoresist to form a patterned photoresist layer such that the patterns on the mask are transferred to the photoresist layer; etching the substrate using the patterned photoresist layer as a mask such that the patterns on the patterned photoresist layer are transferred to the substrate; and removing the patterned photoresist layer.

As the size of semiconductor device continues to shrink, the critical dimension of the photolithography process is gradually approaching or even exceeding its physical limits. Thus, the photolithography technology is facing more severe challenges. The basic idea of the double-patterning technique is to form the final targeted patterns through two patterning process so as to overcome the limit of the photolithography technology which cannot be achieved by a single patterning process.

However, there is still a need to improve the performance of semiconductor devices. The disclosed methods and semiconductor devices are directed to solve one or more problems set forth above and other problems in the art.

BRIEF SUMMARY OF THE DISCLOSURE

One aspect of the present disclosure includes a method for forming a semiconductor device. The method may include providing a to-be-etched layer. The to-be-etched layer may include a plurality of first regions and a plurality of second regions that are alternately arranged along a first direction, a first region of the plurality of first regions adjoins a second region of the plurality of second regions, and the second region includes a second trench region. The method also includes forming a first mask layer on the plurality of first regions and the plurality of second regions of the to-be-etched layer; doping portions of the first mask layer outside second trench regions of the plurality of second regions; forming a second mask layer on the first mask layer after doping the portions of the first mask layer; forming a first trench penetrating the first mask layer and the second mask layer in a first region of the plurality of first regions; forming a mask sidewall spacer on sidewall surfaces of the first trench in the first region of the plurality of first regions; removing the second mask layer after forming the mask sidewall spacer; and removing the first mask layer in the second trench regions by an etching process using the mask sidewall spacer and the doped portions of the first mask layer as an etching mask to form second trenches in the plurality of second trench regions of the plurality of second regions after removing the second mask layer, wherein a sidewall surface of the second trench exposes a corresponding mask sidewall spacer of an adjacent first trench.

Another aspect of the present disclosure includes a semiconductor device. The semiconductor device may include a to-be-etched layer having a plurality of first regions and a plurality of second regions that are alternately arranged along a first direction, a first region of the plurality of first regions adjoins a second region of the plurality of second regions, and the second region includes a second trench region; a first mask layer on the plurality of first regions and the plurality of second regions of the to-be-etched layer; a second mask layer on the first mask layer; a first trench penetrating the first mask layer and the second mask layer over a first region of the plurality of first regions; a mask sidewall spacer on sidewall surfaces of the first trench over the first region of the plurality of first regions; and second trenches over the plurality of second trench regions of the plurality of second regions, wherein a sidewall surface of the second trench exposes a corresponding mask sidewall spacer of an adjacent first trench.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
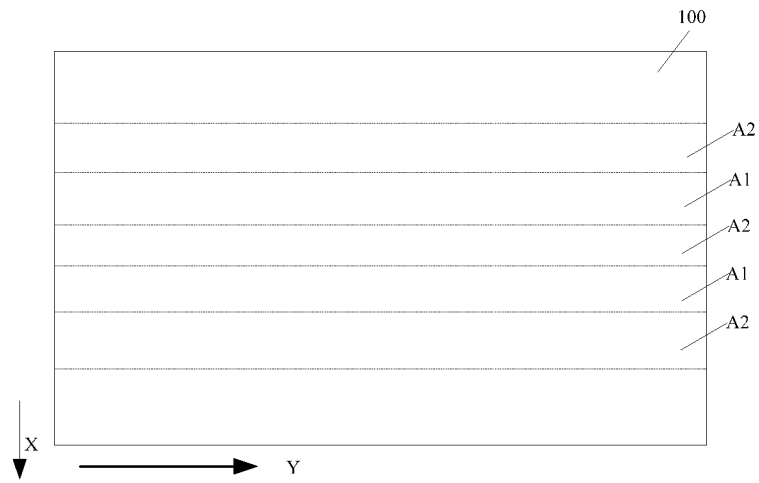
FIGS. 1-13 illustrate structures corresponding to certain stages during an exemplary fabrication process of a semiconductor device consistent with various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

A fabrication process of a semiconductor device usually includes providing a to-be-etched layer including a plurality of discrete first regions and a plurality of discrete second regions. The plurality of first regions and the plurality second regions are arranged alternately along a first direction. A first region is adjacent to a second region. The second region includes a second trench region. A mask layer is formed on the first regions and the second regions of the to-be-etched layer; and doping ions are implanted into the mask layer outside the second trench regions. Then, a first trench penetrating the mask layer is formed in the first region; and a mask sidewall spacer is formed on the sidewall surface of the first trench. Then, the mask layer in the second trench region is removed by an etching process using the mask sidewall spacer and the mask layer doped with the doping ions as a mask to form a second trench in the mask layer in the second region. The sidewall surfaces of the second trench exposes the mask sidewall spacers.

The second trench region is used to determine the position of the second trench. Doping ions are implanted into the mask layer outside the second trench region such that the material of the mask layer outside the second trench region and the material of the mask layer in the second trench region are different. Thus, the second trench is formed after the mask layer in the second trench region is removed.

The mask sidewall spacers need a certain height. The mask sidewall spacers are formed on the sidewall surfaces of the first trenches. The height of the mask sidewall spacers is consistent with the thickness of the mask layer. Accordingly, the thickness of the mask layer also needs to have a certain sufficient value, and the thickness of the mask layer cannot be too thin. On this basis, the ion implantation process for implanting the doping ions into the mask layer outside the second trench regions requires implanting a relatively thick mask layer, and the implantation depth is relatively large. Thus, the scattering of the doping ions in the mask layer is relatively large, the morphology of the implanted regions is not easy to control, and the morphology of the second trenches is not easy to control.

The present disclosure provides a semiconductor device and a method for forming a semiconductor device. The method may include providing a to-be-etched layer. The to-be-etched layer may include a plurality of discrete first regions and a plurality of discrete second regions. The plurality of first regions and the plurality of second regions may be arranged alternately along a first direction. Each of the plurality of first regions may be adjacent to a second region of the plurality of second regions. The second region may include a second trench region. A first mask layer may be formed on the first regions and the second regions of the to-be-etched layer, doping ions may be implanted into the portions of the first mask layer outside the second trench regions. Then, a second mask layer may be formed on the first mask layer; and a first trench penetrating the first mask layer and the second mask layer may be formed in the first region. Then, a mask sidewall spacer may be formed on the sidewall surface of the first trench, and the second mask layer may be removed. After removing the second mask layer, the first mask layer in the second trench region may be removed by an etching process using the mask sidewall spacers and the doped portions of the first mask layer as an etching mask to form a second trench in the first mask layer in the second region. The sidewall surfaces of the second trench may expose the mask sidewall spacers. The method may improve the performance of the semiconductor device.

Figure 13:
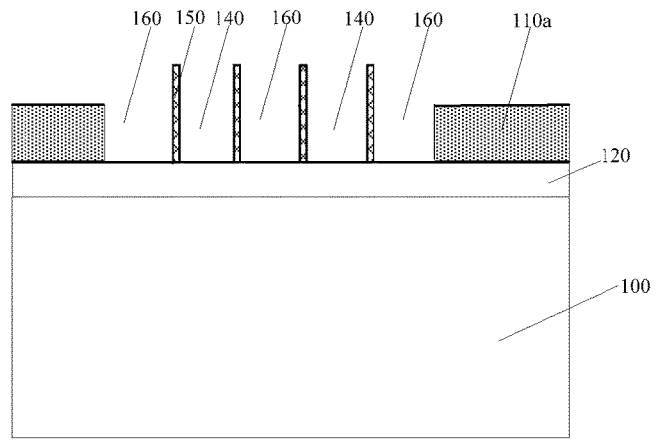
Figure 14:
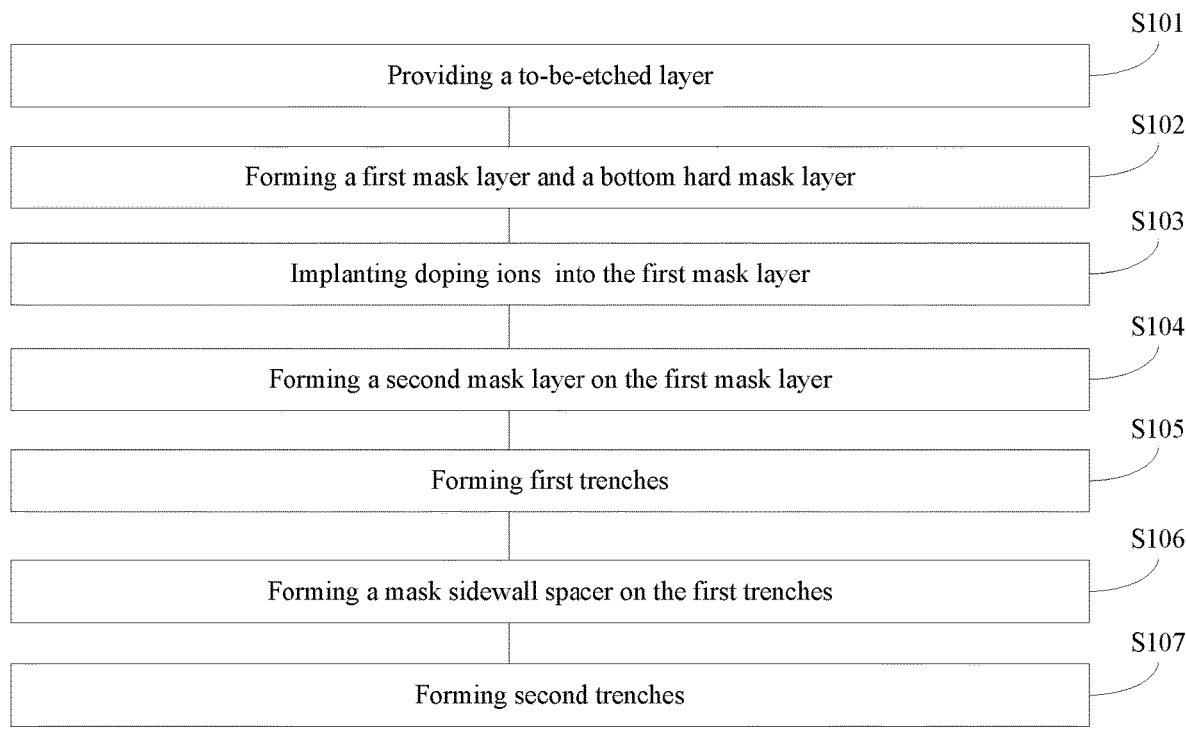
FIG. 14 illustrates an exemplary fabrication process of a semiconductor device consistent with various disclosed embodiments of the present disclosure.

FIG. 14 illustrates an exemplary fabrication process of a semiconductor device consistent with various disclosed embodiments of the present disclosure. FIGS. 1-13 illustrate semiconductor structures corresponding certain stages during the exemplary fabrication process of the semiconductor device consistent with various disclosed embodiments of the present disclosure.

As shown in FIG. 14, at the beginning of the fabrication process, a to-be-etched layer may be provided (S101). FIG. 1 illustrates a corresponding semiconductor structure.

As shown in FIG. 1, a to-be-etched layer 100 is provided. The to-be-etched layer 100 may include a plurality of discrete first regions A1 and a plurality of discrete second regions A2. The plurality of first regions A1 and the plurality of second regions A2 may be arranged alternately along a first direction X. A first regions A1 of the plurality of first regions A1 may be adjacent to a second region A2 of the plurality of second regions A2. A second region A2 of the plurality of second regions A2 may include a second trench region (not labeled).

The plurality of first regions A1 may be arranged along the first direction X, and the plurality of second regions A2 may be arranged along the first direction X. That the plurality of first regions A1 and the plurality of second regions A2 are alternately arranged along the first X direction may mean that there may be only one second region A2 between two adjacent first regions A1, and only one first region A1 between two adjacent second regions. A2.

In one embodiment, the number of the first regions A1 and the number of the second regions A2 may be equal. In some embodiments, the number of the first regions and the number of the second regions may be different.

The to-be-etched layer 100 may be made of any appropriate material, such as silicon oxide, or a low-K (K is less than or equal to 3.9) dielectric material, etc.

Figure 2:
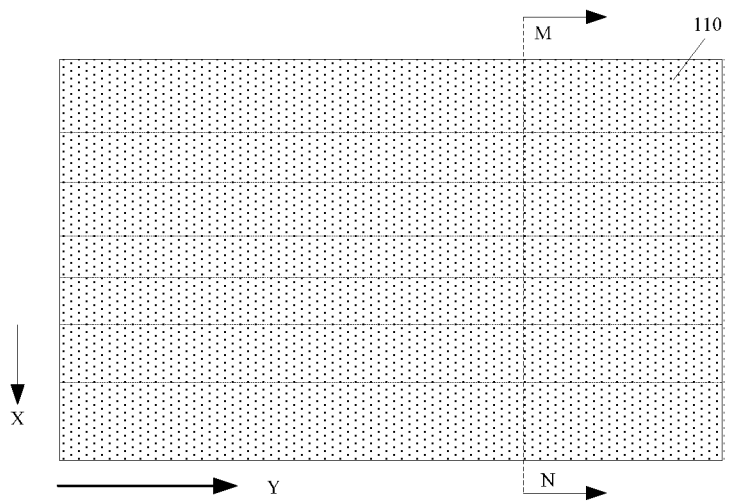
Figure 3:

Returning to FIG. 14, after providing the to-be-etched layer, a first mask layer and a bottom hard mask layer may be formed (S102). FIGS. 2-3 illustrate a corresponding semiconductor structure. FIG. 2 is a schematic diagram based on FIG. 1; and FIG. 3 is an MN-sectional view in FIG. 2.

As shown in FIGS. 2-3, a first mask layer 110 may be formed on the to-be-etched layer 100 over the first regions A1 and the second regions A2. The first mask layer 110 may be made of any appropriate material, such as amorphous silicon, silicon nitride, or silicon oxide, etc. The thickness of the first mask layer 110 may be in a range of approximately 100 angstroms to 400 angstroms.

In one embodiment, before forming the first mask layer 110, a first adhesion layer (not shown) may be formed on the to-be-etched layer 100; and a bottom hard mask 120 may be formed on the first adhesion layer. Then, a second adhesion layer (not shown) may be formed on the bottom hard mask layer 120; and the first mask layer 110 may be formed on the second adhesion layer.

The bottom hard mask layer 120 may be made of any appropriate material, such as titanium nitride, etc.

The material of the first adhesion layer may include SiOC, etc. The material of the second adhesion layer may include SiOC, etc.

The first adhesion layer may be used to improve the adhesion between the bottom hard mask layer 120 and the to-be-etched layer 100, and to make the bonding between the bottom hard mask layer 120 and the to-be-etched layer 100 stronger. The second adhesion layer may be used to improve the adhesion between the first mask layer 110 and the bottom hard mask layer 120, and to make the bonding between the first mask layer 110 and the bottom hard mask layer 120 stronger.

The bottom hard mask layer 120 may be used as an etching stop layer. The bottom hard mask layer 120 may also be as a stop layer for the subsequent planarization of the conductive film. The bottom hard mask layer 120 may be made of a hard mask material. When the first targeted trenches and the second targeted trenches are formed by a subsequent etching process, the etching loss of the bottom hard mask layer 120 may be substantially small, and the stability of the pattern transfer may be substantially high when the patterns on the bottom hard mask layer 120 are transferred to the to-be-etched layer 100.

In one embodiment, the bottom hard mask layer 120 and the first mask layer 110 may be made of different materials.

In some embodiments, the bottom hard mask layer, the first adhesion layer, and the second adhesion layer may be omitted.

Figure 4:
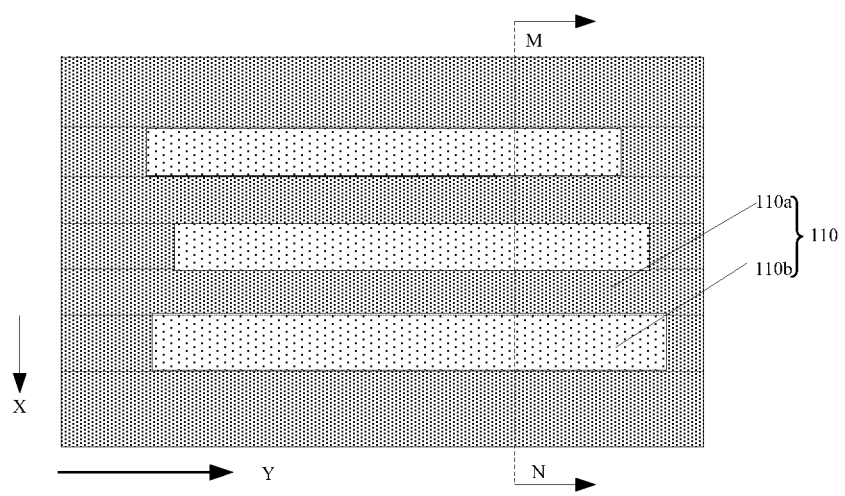
Figure 5:
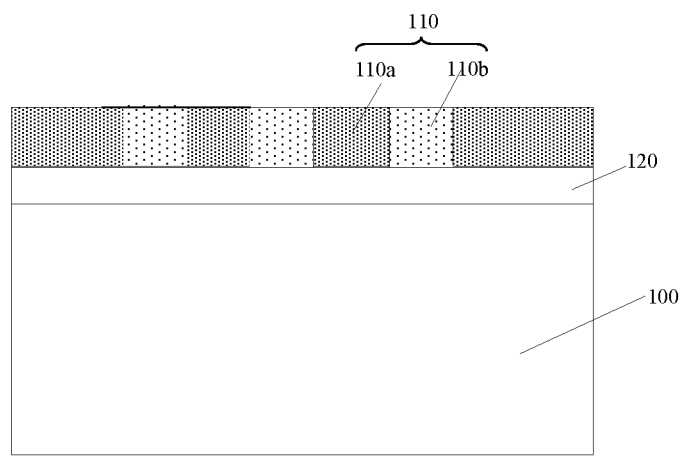

Returning to FIG. 14, after forming the first mask layer, doping ions may be implanted into the first mask layer (S103). FIGS. 4-5 illustrate a corresponding semiconductor structure. FIG. 4 is a schematic diagram based on FIG. 2. FIG. 5 is a schematic diagram based on FIG. 3; and FIG. 5 is an MN-sectional view in FIG. 4.

As shown in FIGS. 4-5, doping ions may be implanted into the regions of the first mask layer 110 outside the second trench regions. The doping ions may include boron ions, or arsenic ions, etc.

In particular, doping ions may be implanted in the regions of the first mask layer 110 over the first regions outside the second trench regions, and in the portions of the first mask layer 110 over the second regions A2 and outside the second trench regions.

Doping ions may be implanted into the first mask layer 110 outside the second trench regions such that the first mask layer 110 may be divided into doped regions 110a and un-doped regions 110b. The doped regions 110a may be doped with the doping ions; and the un-doped regions 110b may not be doped with the doping ions.

The method for implanting the doping ions in the regions of the first mask layer 110 outside the second trench regions may include forming a first flat layer on the first mask layer 110; forming a first bottom anti-reflection layer on the first flat layer; forming a first patterned photoresist layer (not shown) on the first bottom anti-reflection layer by covering the first bottom anti-reflection layer over the second trench regions and exposing the first bottom anti-reflection layer over the first regions and the first bottom anti-reflection layer over the second regions around the second trench regions; etching the first bottom anti-reflection layer and the first flat layer using the first patterned photoresist layer as a mask until the top surface of the first mask layer 110 is exposed; implanting the doping ions in the first mask layer 110 outside the second trench regions using the first patterned photoresist layer as a mask after etching the first bottom anti-reflection layer and the first flat layer using the first patterned photoresist layer until the top surface of the first mask layer 110 is exposed; and removing the first flat layer, the first bottom anti-reflection layer, and the first patterned photoresist layer after implanting the doping ions into the first mask layer 100 outside the second trench regions using the first photoresist layer as the mask.

In the process of implanting the doping ions in the first mask layer 110 outside the second trench regions, because of the blocking of the first mask layer 110 and because first trenches and second trenches may not be formed in the first mask layer 110, the implantation of the doping ions into the material layer under the first mask layer 110 may be avoided.

Further, in the process of implanting the doping ions in the first mask layer 110 outside the second trench regions, the surface of the first mask layer 110 may be substantially flat. Thus, the first flat layer, the first bottom anti-reflection layer, and the first patterned photoresist layer may be formed on the first mask layer 110 with a substantially flat surface. The substantially flat surface may facilitate the exposing process when the first patterned photoresist layer is formed.

Figure 6:
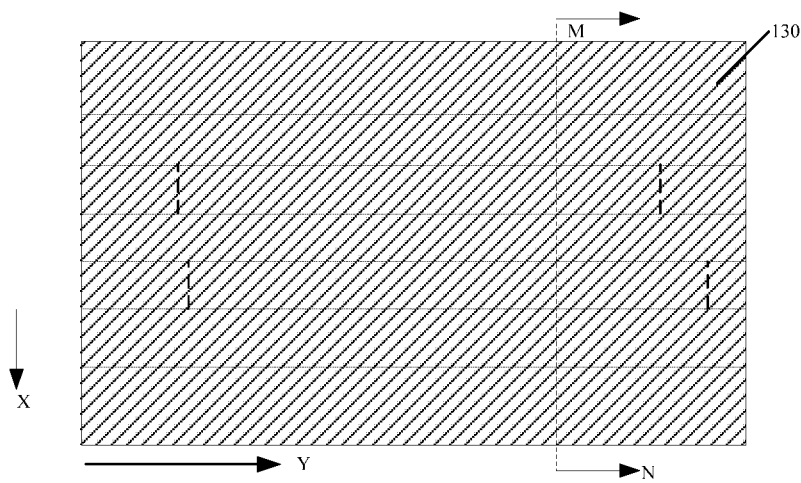
Figure 7:
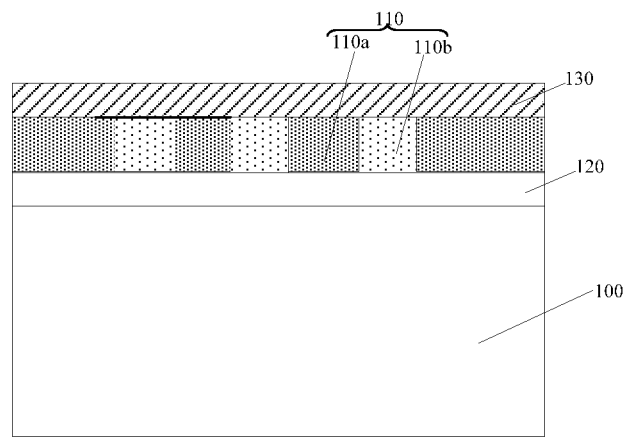

Returning to FIG. 14, after doping portions of the first mask layer outside the second trench regions, a second mask layer may be formed (S104). FIGS. 6-7 illustrate a corresponding semiconductor structure. FIG. 6 is a schematic diagram based on FIG. 4. FIG. 7 is a schematic diagram based on FIG. 5, and FIG. 7 is an MN-sectional view in FIG. 6.

As shown in FIGS. 6-7, after doping the regions of the first mask layer 110 outside the second trench regions, a second mask layer 130 may be formed on the first mask layer 110. The second mask layer 130 may cover the doped regions 110a and the un-doped regions 110b.

The process of forming the second mask layer 130 may be a deposition process, such as a chemical vapor deposition (CVD) process, or a physical vapor deposition (PVD) process, etc.

The second mask layer 130 may be made of any appropriate material, such as amorphous silicon, silicon nitride, or silicon oxide, etc.

In one embodiment, the material of the second mask layer 130 may be same as the material of the un-doped regions 110b of the first mask layer 110. In some embodiments, the material of the second mask layer 130 and the material of the un-doped regions 110b of the first mask layer may be different.

In one embodiment, the sum of the thickness of the first mask layer 110 and the thickness of the second mask layer 130 may be in a range of approximately 30 nm to 80 nm.

In one embodiment, the ratio between the thickness of the first mask layer 110 and the thickness of the second mask layer 130 may be in a range of approximately 1:4 to 4:1. In particular, the thickness of the first mask layer 110 may be in a range of approximately 100 angstroms to 400 angstroms; and the thickness of the second mask layer 130 may be in range of approximately 100 angstroms to 400 angstroms. If the ratio between the thickness of the first mask layer 110 and the thickness of the second mask layer 130 is too large, the thickness of the first mask layer 110 may be substantially large. Thus, the degree for reducing the scattering of doping ions during implanting the doping ions in the first mask layer 110 may be substantially small. If the ratio between the thickness of the first mask layer 110 and the thickness of the second mask layer 130 is too small, the thickness of the first mask layer 110 may be substantially small. Thus, the thickness of the mask layer 110 may be difficult to meet the needs for transferring the patterns to the bottom hard mask layer 120.

Figure 8:
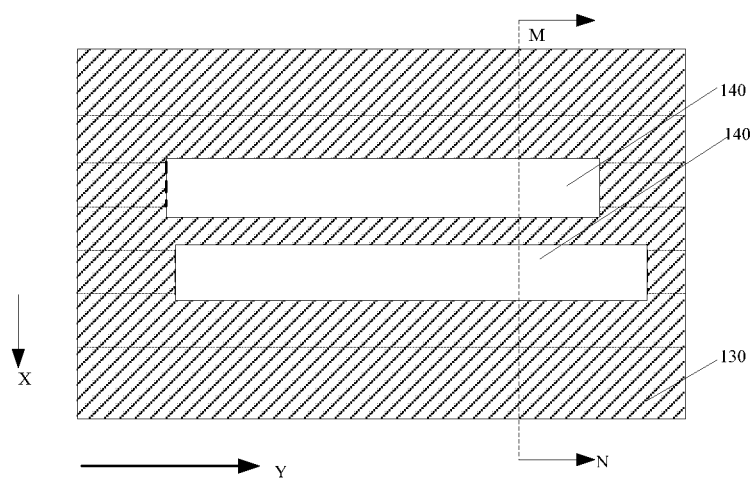
Figure 9:
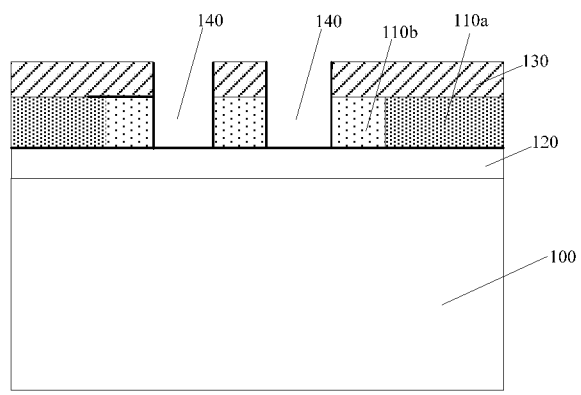

Returning to FIG. 14, after forming the second mask layer, first trenches may be formed in the first regions (S105). FIGS. 8-9 illustrate a corresponding semiconductor structure. FIG. 8 is a schematic diagram based on FIG. 6. FIG. 9 is a schematic diagram based on FIG. 7, and FIG. 9 is an MN-sectional view in FIG. 8.

As shown in FIGS. 8-9, first trenches 140 penetrating the first mask layer 110 and the second mask layer 130 may be formed over the first regions. In particular, one first trench 140 may be formed over one first region.

The extending direction (length direction) of the first trench 140 may be parallel to a second direction Y, and the second direction Y may be perpendicular to the first direction X. Along the first direction X, the first trench 140 may be adjacent to the second region.

Along the first direction X, the width of the first trench 140 may be in a range of approximately 10 nm to 60 nm. Along the first direction X, a distance between two adjacent first trenches 140 may be in range of approximately 10 nm to 60 nm.

Various processes may be used to form the first trenches 140. In one embodiment, a dry etching process may be used to form the first trenches 140. In particular, an anisotropic dry etching process may be used to form the first trenches 140.

In one embodiment, the material of the second mask layer 130 may be same as that of the un-doped regions 110*b* of the first mask layer, one etching process may be used to etch the first mask layer 110 and the second mask layer 130 to form the first trenches 140. Thus, the fabrication process may be simplified.

In some embodiments, the material of the second mask layer may be different from the material of the un-doped regions of the first mask layer. When the etching selectivity of the second mask layer and the un-doped regions is relatively large, it may need to form the top regions of the first trenches by one etching process and form the bottom regions of the first trenches by another etching process.

In one embodiment, in the dry etching process for forming the first trenches 140, the etching rate of the portions the first mask layer 110 implanted with the doping ions (the doped regions) and the etching rate of the portions of the first mask layer 110 without being implanted with doping ions (un-doped regions) may be similar, and the degree of change of the etching performance of the first mask layer 110 by the doping ions may be substantially small in the dry etching process. Thus, the difficulty of the etching process for forming the first trenches 140 may be reduced. In one embodiment, during the process for forming the first trenches 140, the ratio of etching rates between the regions of the first mask layer 110 with the doping ions and the etching rate of the regions of the first mask layer 110 without the doping ions may be in a range of approximately 1:1.5 to 1.5:1.

During the process for forming the first trenches 140, the etching rate ratio between doped regions of the first mask layer 110 and the non-doped regions of the first mask layer 110 may be in a range of approximately 1:1.5 to 1.5:1. The etching rate difference between doped regions of the first mask layer 110 and the un-doped regions of first mask layer 110 may be substantially small, along the first direction, for a first trench only having a second trench region at one side, the difference in the morphology of the sidewall surfaces of the first trench at both sides along the first direction may be substantially small.

Figure 10:
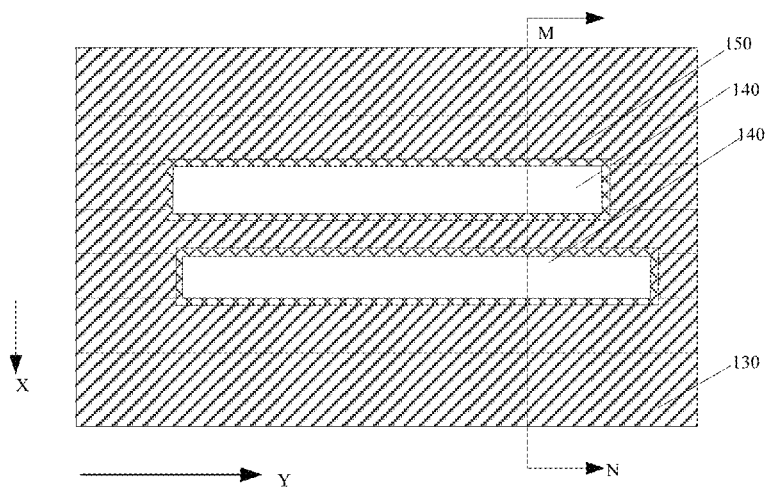
Figure 11:
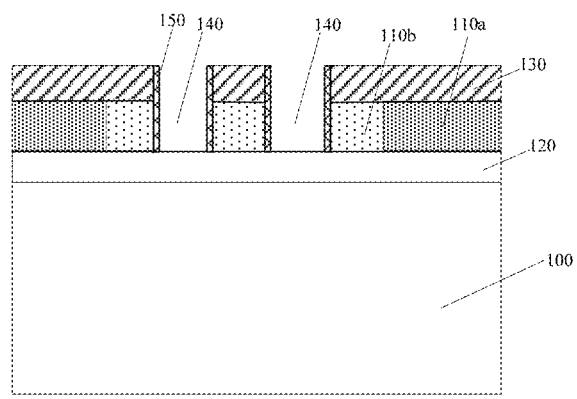

Returning to FIG. 14, after forming the first trenches, mask sidewall spacers may be formed (S106). FIGS. 10-11 illustrate a corresponding semiconductor structure. FIG. 10 is a schematic diagram based on FIG. 8. FIG. 11 is a schematic diagram based on FIG. 9, and FIG. 11 is an MN-sectional view in FIG. 10.

As shown in FIGS. 10-11, a mask sidewall spacer 150 is formed on each sidewall surface of the first trenches 140.

The mask sidewall spacers 150 may be made of any appropriate material, such as $SiO_2$, SiN, $TiO_2$, TiN, AlN, or $Al_2O_3$, etc. The material of the mask sidewall spacers 150 may be different from the material of the first mask layer 110. In particular, the material of the mask sidewall spacers 150 may be different from the material of the doped regions 110*a* of the first mask layer 110 and different from the material of the un-doped regions 110*b* of the first mask layer 110.

The mask sidewall spacers 150 may be used to separate the first trenches 140 and the subsequently formed second trenches.

The method for forming the mask sidewall spacers 150 may include forming a mask sidewall spacer film on the sidewall surfaces and the bottom surfaces of the first trenches 140 and the top surface of the second mask layer 130; and etching back the mask sidewall spacer film until the mask sidewall spacer film on the bottoms of the first trenches 140 and the mask sidewall spacer film on the top surface of the second mask layer 130 are removed. The process of forming the mask sidewall spacer film may be a deposition process, such as an atomic layer deposition (ALD) process, etc. By using the ALD process to the mask sidewall spacer film, the thickness uniformity and the quality of the mask sidewall spacers 150 may be as desired.

In one embodiment, the mask sidewall spacers 150 may be formed on both sidewall surfaces of the first trenches 140 along the first direction X, and the mask sidewall spacers 150 may also be formed on both sidewall surfaces of the first trenches 140 along the second direction Y. The height of the mask sidewall spacers 150 on the sidewall surfaces of the first trenches 140 may level with the top surface of the second mask layer 130. In particular, the mask sidewall spacers 150 may cover not only the sidewall surfaces of the first mask layer 110 but also the sidewall surfaces of the second mask layer 130. For such a configuration, the mask sidewall spacers 150 may be sufficiently high such that the mask sidewall spacers 150 may meet the thickness requirements for subsequently transferring the patterns to the bottom hard mask layer 120.

In one embodiment, along a direction perpendicular to the top surface of the to-be-etched layer 100, the height of the mask sidewall spacer 150 may be in a range of approximately 30 nm to 80 nm. The height of the mask sidewall spacer 150 refers to the dimension of the mask sidewall spacer 150 along the direction perpendicular to the surface of the to-be-etched layer 100.

The thickness of the mask sidewall spacer 150 may be in a range of approximately 5 nm to 20 nm. The thickness of the mask sidewall spacer 150 refers to a dimension of the mask sidewall spacer 150 along the direction perpendicular to the sidewall surfaces of the first trench 140.

Figure 12:
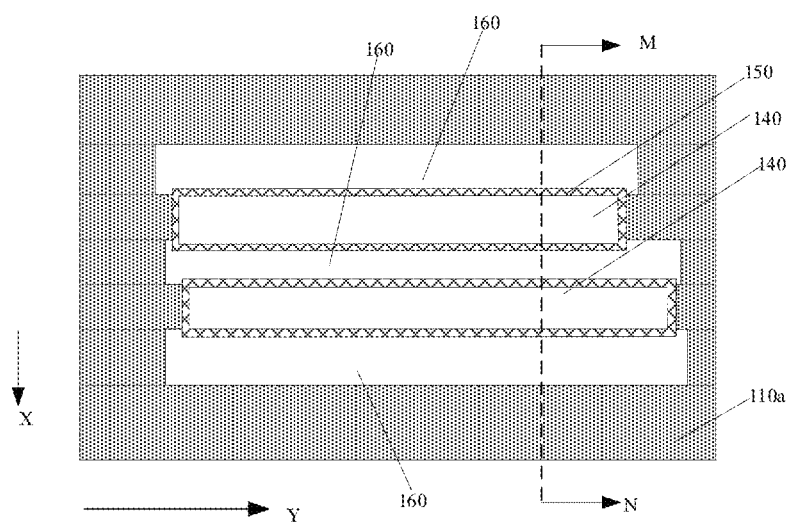

Returning to FIG. 14, after forming the mask sidewall spacers, second trenches may be formed (S107). FIGS. 12-13 illustrate a corresponding semiconductor structure. FIG. 12 is a schematic diagram based on FIG. 10. FIG. 13 is a schematic diagram based on FIG. 11, and FIG. 13 is an MN-sectional view in FIG. 12

As shown in FIGS. 12-13, after forming the mask sidewall spacers 150, the second mask layer 130 may be removed. After removing the second mask layer 130, a second trench 160 may be formed in the first mask layer 110 over each second region A2 by etching the first mask layer 110 over the second trench regions using the mask sidewall spacers 150 and the regions of the first mask layer 110 with the doping ions as an etching mask. The sidewall surface of the second trench 160 may expose the corresponding mask sidewall spacer 150 of an adjacent first trench.

The sidewall surfaces of the second trenches 160 parallel to the second direction Y may expose the corresponding mask sidewall spacers 150 of adjacent first trenches. The extending direction (length direction) of the second trenches 160 may be parallel to the second direction Y. Along the first direction X, the width of the second trench 160 may be in a range of approximately 10 nm to 60 nm.

In one embodiment, the process for removing the second mask layer 130 may be a wet etching process, and the process for removing the first mask layer 110 in the second trench regions 160 may be a wet etching process.

In one embodiment, the doping ions may be implanted into the first mask layer 110 outside the second trench regions. The degree of change in the etching performance of the first mask layer 110 by the doping ions may be relatively greater in the wet etching process. Thus, the first mask layer 110 over the second trench regions may be removed by using the wet etching process.

In one embodiment, the material of the first mask layer 110 in the second trench regions and the material of the second mask layer 130 are same. The second mask layer 130 and the first mask layer 110 in the second trench regions may be removed in the same etching process. Thus, the fabrication process may be simplified.

During the process for removing the first mask layer 110 over the second trench regions by the etching process, the etching rate of un-doped regions of the first mask layer 110 may be greater than the etching rate of the doped portions the first mask layer 110.

In one embodiment, during the process for removing the first mask layer 110 of the second trench regions by the etching process, the etching rate of the un-doped regions 110*b* may be referred to as a first etching rate, and the etching rate the doped regions 110*a* may be referred to as a second etching rate, and the ratio between the first etching rate and the second etching rate may be greater than or equal to approximately 100, such as 150, etc.

Because the material of the mask sidewall spacer 150 may be different from the material of the un-doped regions 110*b*, the process for removing the first mask layer 110 over the second trench regions may not etch through the mask sidewall spacers 150, and the direct through connection between the first trench 140 and the second trench 160 may be avoided. In particular, the second trench 160 and the first trench 140 may be separated by the mask sidewall spacer 150.

In one embodiment, after forming the second trenches, the to-be-etched layer 100 at the bottom of the first trench 140 may be etched to form a first targeted trench in the to-be-etched layer 100; and the to-be-etched layer 100 at the bottom of the second trench 160 may be etched to form a second targeted trench in the to-be-etched layer 100. Then, a first conductive layer may be formed in the first targeted trench; and a second conductive layer may be formed in the second targeted trench. In one embodiment, the second targeted trench may be formed when forming the first targeted trench; and the fabrication process may be simplified.

In one embodiment, before etching the to-be-etched layer 100 at the bottom of the first trench 140 and the to-be-etched-layer 100 at the bottom of the second trench 160, the second adhesion layer, the bottom hard mask layer 120 and the first adhesion layer at the bottom of the first trench 140 to form a first hard mask trench in the bottom hard mask layer 120 at the bottom of the first trench 140. Further, the second adhesion layer, the bottom hard mask layer 120 and the first adhesion layer at the bottom of the second trench 160 may be etched to form a second hard mask trench in the bottom hard mask layer 120 at the bottom of the second trench 160.

In one embodiment, after etching the second adhesion layer, the bottom hard mask layer and the first adhesion layer at the bottom of the first trench, and after etching the second adhesion layer, the bottom hard mask layer and the first adhesive layer at the bottom of the second trench are etched, and before forming the first conductive layer and the second conductive layer, the first mask layer and the second adhesive layer may be removed. After removing the first mask layer and the second adhesive layer, the to-be-etched layer at the bottom of the first hard mask trench may be etched to form a first targeted trench in the to-be-etched layer, and the to-be-etched layer at the bottom of the second hard mask trench may be etched to form a second targeted trench in the to-be-etched layer. After forming the first targeted trench and the second targeted trench, a conductive film may be formed in the first targeted trench and the second targeted trench, and on the bottom hard mask layer. Then, the conductive film may be planarized until the top surface of the bottom hard mask layer is exposed to a first conductive layer in the first targeted trench, and a second conductive layer in the second targeted trench. After forming the first conductive layer and the second conductive layer, the bottom hard mask layer and the first adhesion layer may be removed.

The first conductive layer and the second conductive layer may be made of any appropriate material, such as copper, or aluminum, etc.

The present disclosure also provides a semiconductor device. FIGS. 11-12 illustrate an exemplary semiconductor device consistent with various disclosed embodiments of the present disclosure. FIG. 12 is an MN-sectional view in FIG. 11.

As shown in FIGS. 11-12, the semiconductor device may include a to-be-etched layer 100 having a plurality of discrete first regions and a plurality of discrete second regions. The plurality of first discrete first regions and the plurality of discrete second region may alternatively arranged. The semiconductor device may also include a bottom hard mask layer 120 on the to-be-etched layer 100 and a first hard mask layer 110 on the bottom hard mask layer 120 and a second hard mask layer 130 on the second hard mask layer 130. The semiconductor device may also a plurality of first trenches 140 and a plurality of second trenches 160 formed in the first mask layer 110 and the second mask layer 130. The plurality of first trenches 140 and the plurality of second trenches 160 are alternatively distributed. Further, the semiconductor device may include a plurality of sidewall spacers 150 each distributed between one first trench 140 and one second trench 160. The detailed structures and intermediate structures are described above with respect to the fabrication processes.

The technical solutions of the present disclosure may have at least the following beneficial effects.

In the disclosed methods for forming the semiconductor device, the second trench regions may define the positions of the second trenches. The portions of the first mask layer outside the second trench regions may be doped with the doping ions to make the material of the first mask layer outside second trench regions to be different from the material of the mask layer in the second trench regions. Thus, after removing the first mask layer over the second trench regions, the second trenches may be formed. Before forming the second mask layer, the doping ions may be doped into the portions of the first mask layer outside the second trench regions. Thus, the ion implantation process may not need to implant the doping ions in the second mask layer. Accordingly, the depth of the ion implantation process may be relatively small; and the scattering of the doping ions in the first mask layer may be substantially small during the ion implantation process for implanting the doping ions in the portions of the first mask layer outside the second trench regions. Thus, the morphology of the implanted regions may be easily controlled; and the morphology of the second trenches may be easily controlled. Accordingly, the performance of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device, comprising:
a to-be-etched layer having a plurality of first regions and a plurality of second regions that are alternately arranged along a first direction,
wherein a first region of the plurality of first regions adjoins a second region of the plurality of second regions;
a first mask layer on the plurality of first regions and the plurality of second regions of the to-be-etched layer;
a first trench enclosed by a mask sidewall spacer, the mask sidewall spacer and the first trench together penetrating the first mask layer over a first region of the plurality of first regions;
a plurality of second trenches formed in the plurality of second regions, wherein the mask sidewall spacer, that encloses the first trench, is sandwiched between adjacent second trenches along the first direction; and
along a second direction perpendicular to the first direction, the first mask layer is in contact with the plurality of second trenches and the mask sidewall spacer.

2. The semiconductor device according to claim 1, wherein:
the first mask layer is made of one or more of amorphous silicon, silicon nitride, or silicon oxide.

3. The semiconductor device according to claim 1, wherein:
the mask sidewall spacer, that encloses the first trench, has a top surface higher than a top surface of the first mask layer, providing a protruded portion over the top surface of the first mask layer.

4. The semiconductor device according to claim 3, wherein:
along a direction perpendicular to a top surface of the to-be-etched layer, a ratio between height of the first mask layer and a height of the protruded portion of the mask sidewall spacer is in a range of approximately 1:4 to 4:1.

5. The semiconductor device according to claim 1, wherein:
a thickness of the mask sidewall spacer is in a range of approximately 5 nm-20 nm.

6. The semiconductor device according to claim 1, wherein:
along a direction perpendicular to a top surface of the to-be-etched layer, a height of the mask sidewall spacer is in a range of approximately 30 nm-80 nm.

7. The semiconductor device according to claim 1, wherein:
the mask sidewall spacer is made of one or more of $SiO_2$, SiN, $TiO_2$, TiN, AlN, or $Al_2O_3$.

8. The semiconductor device according to claim 1, further including:
a bottom hard mask layer between the to-be-etched layer and the first mask layer.

9. The semiconductor device according to claim 8, further including:
a first adhesion layer between the to-be-etched layer and the bottom hard mask layer, and
a second adhesion layer between the bottom hard mask layer and the first mask layer.

10. The semiconductor device according to claim 8, wherein:
the first trench is further penetrating the bottom hard mask layer, and the second trench is further penetrating the bottom hard mask layer.

11. The semiconductor device according to claim 10, further including:
a first conductive layer formed in the first trench, and
a second conductive layer formed in the second trench.

12. The semiconductor device according to claim 1, wherein:
each second trench is enclosed by portions of the first mask layer and portions of the mask sidewall spacer.

13. The semiconductor device according to claim 1, wherein:
along a second direction, the mask sidewall spacer is in contact with the first mask layer on both sides of the mask sidewall spacer.

14. The semiconductor device according to claim 1, wherein:
the first mask layer containing doping ions.

15. The semiconductor device according to claim 1, wherein:
the plurality of second trenches includes a first second-trench and a second second-trench, each separating the mask sidewall spacer from the first mask layer along the first direction, and
all first trenches are located between the first second-trench and the second second-trench along the first direction.

* * * * *